United States Patent
Pillay et al.

(10) Patent No.: US 6,359,315 B1
(45) Date of Patent: Mar. 19, 2002

(54) CIRCUITS FOR CONTROLLING A BIDIRECTIONAL TERMINAL AND SYSTEMS USING THE SAME

(75) Inventors: Sanjay Pillay; Peng Liu, both of Austin, TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 09/631,587

(22) Filed: Aug. 3, 2000

(51) Int. Cl.[7] .......................................... H03K 19/0944
(52) U.S. Cl. ........................ 257/368; 257/357; 326/86
(58) Field of Search ................................. 257/368, 369, 257/357; 326/81

(56) References Cited

U.S. PATENT DOCUMENTS

| | | | |
|---|---|---|---|
| 4,434,497 A | * | 2/1984 | Rolfe |
| 5,381,062 A | * | 1/1995 | Morris |
| 5,966,026 A | * | 10/1999 | Partovi et al. |
| 6,218,706 B1 | * | 4/2001 | Waggoner et al. |

* cited by examiner

Primary Examiner—Charles Bowers
Assistant Examiner—Stephen W. Smoot
(74) Attorney, Agent, or Firm—James J. Murphy; Winstead Sechrest & Minick

(57) ABSTRACT

Circuitry 400 for controlling a bidirectional terminal includes an output transistor 405 for selectively coupling the bidirectional terminal to a voltage rail, output transistor 405 turning on when a voltage at a control node falls below a preselected threshold voltage. A diode 402 is coupled to the control node and has a threshold voltage lower than the threshold voltage of the transistor for maintaining the output transistor in a substantially turned off state by maintaining the voltage at the control node above the $V_{DD}-V_T$, where $V_{DD}$ is the supply voltage and $V_T$ is the threshold voltage of transistor 405.

20 Claims, 3 Drawing Sheets

CIRCUITS FOR CONTROLLING A BIDIRECTIONAL TERMINAL AND SYSTEMS USING THE SAME

CROSS-REFERENCE TO RELATED APPLICATION:

The following co-pending and co-assigned application contains related information and is hereby incorporated by reference:

Ser. No. 08/970,979, entitled DUAL PROCESSOR DIGITAL AUDIO DECODER WITH SHARED MEMORY DATA TRANSFER AND TASK PARTITIONING FOR DECOMPRESSING COMPRESSED AUDIODATA, AND SYSTEMS AND METHODS USING THE SAME filed Nov. 14, 1997 and issued as U.S. Pat. No. 6,081,783 on Jun. 27, 2000.

BACKGROUND OF THE INVENTION

1. Field of the Invention

The present invention relates in general to audio data processing and in particular, circuits for controlling a bidirectional terminal and systems using the same.

2. Description of the Related Art

The ability to process audio information has become increasingly important in the personal computer (PC) environment. Among other things, audio is important in many multimedia applications, such as gaming and telecommunications. Audio functionality is therefore typically available on most conventional PCs, either in the form of an add-on audio board or as a standard feature provided on the motherboard itself. In fact, PC users increasingly expect not only audio functionality but high quality sound capability. Additionally, digital audio plays a significant role outside the traditional PC realm, such as in compact disk players, VCRs and televisions. As the audio technology progresses, digital applications are increasingly sophisticated as improvements in sound quality and sound effects are sought.

One of the key components in many digital audio information processing systems is the decoder. Generally, the decoder receives data in a compressed form and converts that data into a decompressed digital form. The decompressed digital data is then passed on for further processing, such as filtering, expansion or mixing, conversion into analog form, and eventually conversion into audible tones. In other words the decoder must provide the proper hardware and software interfaces to communicate with the possible compressed (and decompressed) data sources, as well as the destination digital and/or audio devices. Since, there are a number of different audio compression/decompression formats and interface definitions, such as Dolby AC-3 and S/PDIF (Sony/Phillips Digital Interface), a state of the art digital audio decoder should at least be capable of supporting multiple compression/decompression formats. In addition, the decoder must have the proper interfaces required for overall control and debugging by a host microprocessor or microcontroller.

During the decompression of streaming compressed audio data, as well as during other decoder operations, arithmetic and logic operations must be continuously performed. In order to maximize overall system efficiency and data throughput, the speed at which the arithmetic and logic operations are performed also must be maximized. Thus, the need has arisen for methods for increasing the speed of arithmetic and logic operations in high speed applications, including audio decoders.

SUMMARY OF THE INVENTION

According to one embodiment of the principles of the present invention, circuitry is disclosed for controlling a bidirectional terminal. An output transistor is provided for selectively coupling the bidirectional terminal to a voltage rail, the output transistor turning on when a voltage at a control node falls below a preselected threshold voltage. A diode is coupled to the control node which has a threshold voltage lower than the threshold voltage of the output transistor and maintains the output transistor in a substantially turned off state by maintaining the voltage at the control node above $V_{DD}-V_T$, of the output transistor, where $V_{DD}$ is the supply voltage and $V_T$ is the threshold voltage of the output transistor.

By advantageous use of the short channel effect, the inventive concepts insure that the output transistor fully turns off during a transition of the pad from a transmit node to a receive node. In particular, these concepts insure that the output impedance rapidly transitions to a high state when the pad is transition from a logic high output node to a high impedance input node. Moreover, these concepts can be applied to systems which are tolerant to received peak signal voltages in excess of the on chip power supply voltage. Additionally, the inventive concepts also insure that the turn-off of the output transistor occurs independent of process variation.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENT:

The principles of the present invention and their advantages are best understood by referring to the illustrated embodiment depicted in FIGS. 1A–1C, 2–4 of the drawings, in which like numbers designate like parts.

Figure 1A:
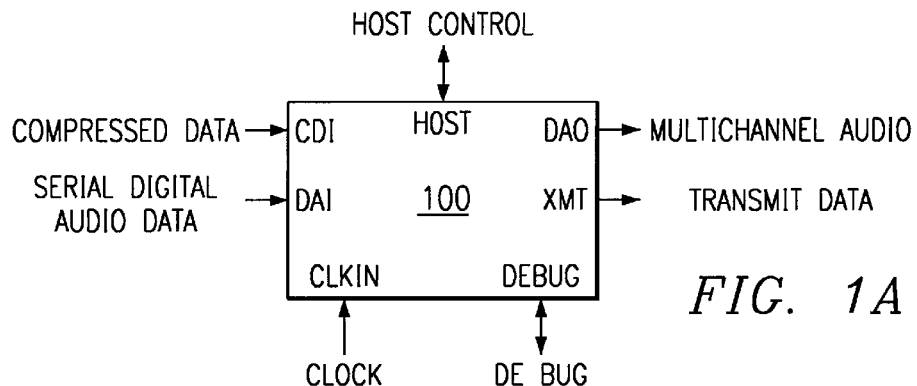
FIG. 1A is a diagram of a multichannel audio decoder embodying the principles of the present invention.

FIG. 1A is a general overview of an audio information decoder 100 embodying the principles of the present invention. Decoder 100 is operable to receive data in any one of a number of formats, including compressed data in conforming to the AC-3 digital audio compression standard, (as defined by the United States Advanced Television System Committee) through a compressed data input port CDI. An independent digital audio data (DAI) port provides for the input of PCM, S/PDIF, or non-compressed digital audio data.

A digital audio output (DAO) port provides for the output of multiple-channel decompressed digital audio data. Independently, decoder 100 can transmit data in the S/PDIF (Sony-Phillips Digital Interface) format through a transmit port XMT.

Decoder 100 operates under the control of a host microprocessor through a host port HOST and supports debugging by an external debugging system through the debug port DEBUG. The CLK port supports the input of a master clock for generation of the timing signals within decoder 100.

While decoder 100 can be used to decompress other types of compressed digital data, it is particularly advantageous to use decoder 100 for decompression of AC-3 bits streams.

Therefore, for understanding the utility and advantages of decoder 100, consider the case of when the compressed data received at the compressed data input (CDI) port has been compressed in accordance with the AC-3 standard.

Generally, AC-3 data is compressed using an algorithm which achieves high coding gain (i.e., the ratio of the input bit rate to the output bit rate) by coarsely quantizing a frequency domain representation of the audio signal. To do so, an input sequence of audio PCM time samples is transformed to the frequency domain as a sequence of blocks of frequency co-efficient. Generally, these overlapping blocks, each of 512 time samples, are multiplied by a time window and transformed into the frequency domain. Because the blocks of time samples overlap, each PCM input sample is represented by two sequential blocks factor transformation into the frequency domain. The frequency domain representation may then be decimated by a factor of two such that each block contains 256 frequency coefficients, with each frequency coefficient represented in binary exponential notation as an exponent and a mantissa.

Next, the exponents are encoded into coarse representation of the signal spectrum (spectral envelope), which is in turn used in a bit allocation routine that determines the number of bits required to encoding each mantissa. The spectral envelope and the coarsely quantized mantissas for six audio blocks (1536 audio samples) are formatted into an AC-3 frame. An AC bit stream is a sequence of the AC-3 frames.

In addition to the transformed data, the AC bit stream also includes a number of additional information. For instance, each frame may include a frame header which indicates the bit rate, sample rate, number of encoded samples, and similar information necessary to subsequently synchronize and decode the AC-3 bit stream. Error detection codes may also inserted such that the device such as decoder 100 can verify that each received frame of AC-3 data does not contain any errors. A number of additional operations may be performed on the bit stream before transmission to the decoder. For a more complete definition of AC-3 compression, reference is now made to the digital audio compression standard (AC-3) available from the advanced televisions systems committee, incorporated herein by reference.

In order to decompress under the AC-3 standard, decoder 100 essentially must perform the inverse of the above described process. Among other things, decoder 100 synchronizes to the received AC-3 bit stream, checks for errors and deformats received AC-3 data audio. In particular, decoder 100 decodes spectral envelope and the quantitized mantissas. Among other things, a bit allocation routine is used to unpack and de-quantitize the mantissas. The spectral envelope is encoded to produce the exponents, then, a reverse transformation is performed to transform the exponents and mantissas to decoded PCM samples in the time domain.

Figure 1B:
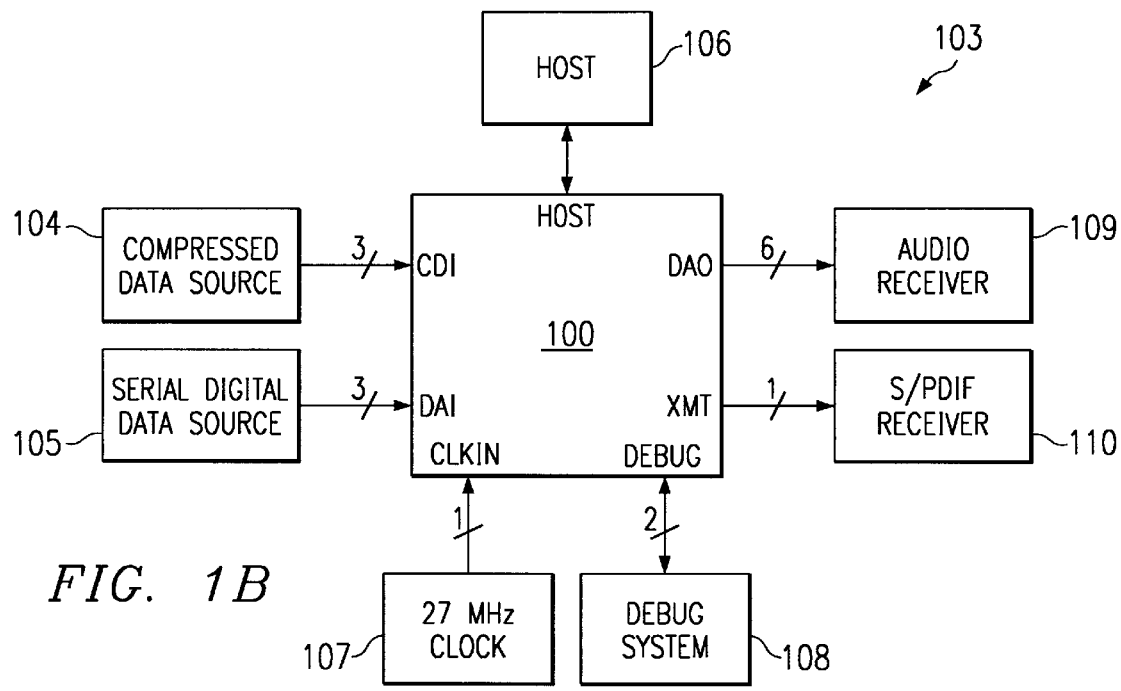
FIG. 1B is a diagram showing the decoder of FIG. 1 in an exemplary system context.

FIG. 1B shows decoder 100 embodied in a representative system 103. Decoder 100 as shown includes three compressed data input (CDI) pins for receiving compressed data from a compressed audio data source 104 and an additional three digital audio input (DAI) pins for receiving serial digital audio data from a digital audio source 105. Examples of compressed serial digital audio source 105, and in particular of AC-3 compressed digital sources, are digital video discs and laser disc players.

Host port (HOST) allows coupling to a host processor 106, which is generally a microcontroller or microprocessor that maintains control over the audio system 103. For instance, in one embodiment, host processor 106 is the microprocessor in a personal computer (PC) and System 103 is a PC-based sound system. In another embodiment, host processor 106 is a microcontroller in an audio receiver or controller unit and system 103 is a non-PC-based entertainment system such as conventional home entertainment systems produced by Sony, Pioneer, and others. A master clock, shown here, is generated externally by clock source 107. The debug port (DEBUG) consists of two lines for connection with an external debugger, which is typically a PC-based device.

Decoder 100 has six output lines for outputting multichannel audio digital data (DAO) to digital audio receiver 109 in any one of a number of formats including 3-lines out, 2/2/2, 4/2/0, 4/0/2 and 6/0/0. A transmit port (XMT) allows for the transmission of S/PDIF data to an S/PDIF receiver 110. These outputs may be coupled, for example, to digital to analog converters or codecs for transmission to analog receiver circuitry.

Figure 1C:
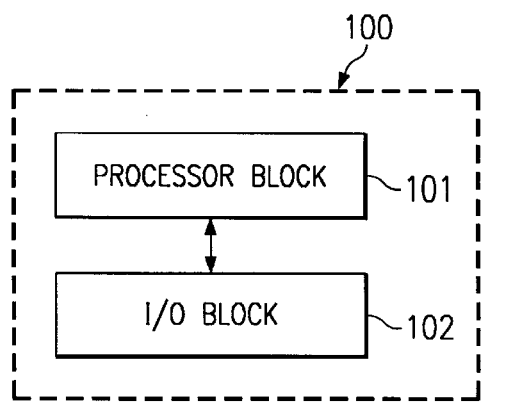
FIG. 1C is a diagram showing the partitioning of the decoder into a processor block and an input/output (I/O) block.

FIG. 1C is a high level functional block diagram of a multichannel audio decoder 100 embodying the principles of the present invention. Decoder 100 is divided into two major sections, a Processor Block 101 and the I/O Block 102. Processor Block 101 includes two digital signal processor (DSP) cores, DSP memory, and system reset control. I/O Block 102 includes Interprocessor communication registers, peripheral I/O units with their necessary support logic, and interrupt controls. Blocks 101 and 102 communicate via interconnection with the I/O buses of the respective DSP cores. For instance, I/O Block 102 can generate interrupt requests and flag information for communication with Processor Block 101. All peripheral control and status registers are mapped to the DSP I/O buses for configuration by the DSPs.

Figure 2:
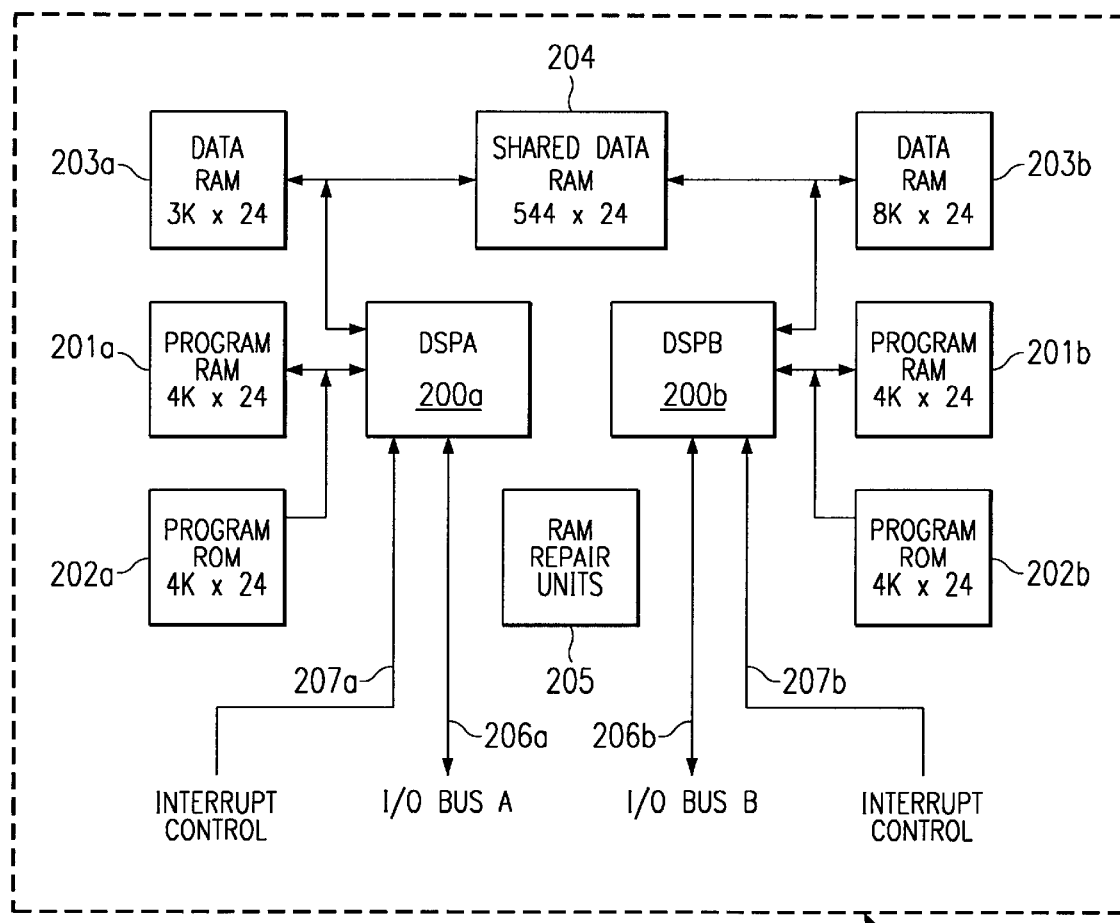
FIG. 2 is a diagram of the processor block of FIG. 1C.

FIG. 2 is a detailed functional block diagram of processor block 101. Processor block 101 includes two DSP cores 200*a* and 200*b*, labeled DSPA and DSPB respectively. Cores 200*a* and 200*b* operate in conjunction with respective dedicated program RAM 201*a* and 201*b*, program ROM 202*a* and 202*b*, and data RAM 203*a* and 203*b*. Shared data RAM 204, which the DSPs 200*a* and 200*b* can both access, provides for the exchange of data, such as PCM data and processing coefficients, between processors 200*a* and 200*b*. Processor block 101 also contains a RAM repair unit 205 that can repair a predetermined number of RAM locations within the on-chip RAM arrays to increase die yield.

DSP cores 200*a* and 200*b* respectively communicate with the peripherals through 1/0 Block 102 via their respective I/O buses 206*a*, 206*b*. The peripherals send interrupt and flag information back to the processor block via interrupt interfaces 207*a*, 207*b*.

DSP cores 200*a* and 200*b* are each based upon a time-multiplexed dual-bus architecture. As shown in FIG. 2, DSPs 200*a* and 200*b* are each associated with program and data RAM blocks 202 and 203. Data Memory 203 typically contains buffered audio data and intermediate processing results. Program Memory 201/202 (referring to Program RAM 201 and Program ROM 202 collectively) contains the program running at a particular time. Program Memory 201/202 is also typically used to store filter coefficients, as required by the respective DSP 200a and 200b during processing.

DSP cores 200a and 200b also respectively include a Data Address unit for generating addresses to data memory 203, a Program Address unit for generating addresses to Program Memory 201/202, an Execution Unit which includes the circuitry required to perform arithmetic and logic operations on data received from either data memory or program memory, and buses for carrying instructions and data to support DSP operations.

The DSP core_Buses are respectively referred to as the source A/destination bus (Bus_A) and the source B/instruction bus (Bus_B). Bus_A connects to data memory 203, the data address unit (DAU), the A input of the execution unit (EU) and I/O registers 300. Bus_B connects to program memory 201/202, the program address unit (PAU) the DAU, and the B input to the Execution Unit (EU).

I/O registers 300 discussed in further detail below, provide for direct register control of respective DSP 200a and 200b from an external device, such as Host 106 (FIG. 1B).

The overall operation of respective DSPs 200a and 200b can be described in reference to the diagram of FIG. 2. All instructions (instruction cycles) take two clock cycles (periods) to complete. During the first clock cycle, one operand is read from data memory 203 and a second operand is read from program memory 201/202 as directed by a prefetch instruction from program memory 201/202. During the second clock cycle, the result is stored in data memory 203 and the next instruction is prefetched from program memory 201/202.

Instruction execution occurs in four phases. In the first phase (T0), an instruction from a selected instruction register is decoded. In the second phase (T1), the A and B operands are read from registers or data memory. In the third phase (T2), an arithmetic or logic operation is performed by the Execution Unit. In the fourth phase (T3), the result is stored and the next instruction is pre-fetched.

It should be noted that during the first half of the execution of typical arithmetic or logical instruction, the A operand to the EU is presented on Bus_A and the B operand to the EU is presented on Bus_B. During the second half of the execution of the instruction, the result from the EU is presented on Bus_A and the next instruction fetched is presented on Bus_B.

Figure 3:
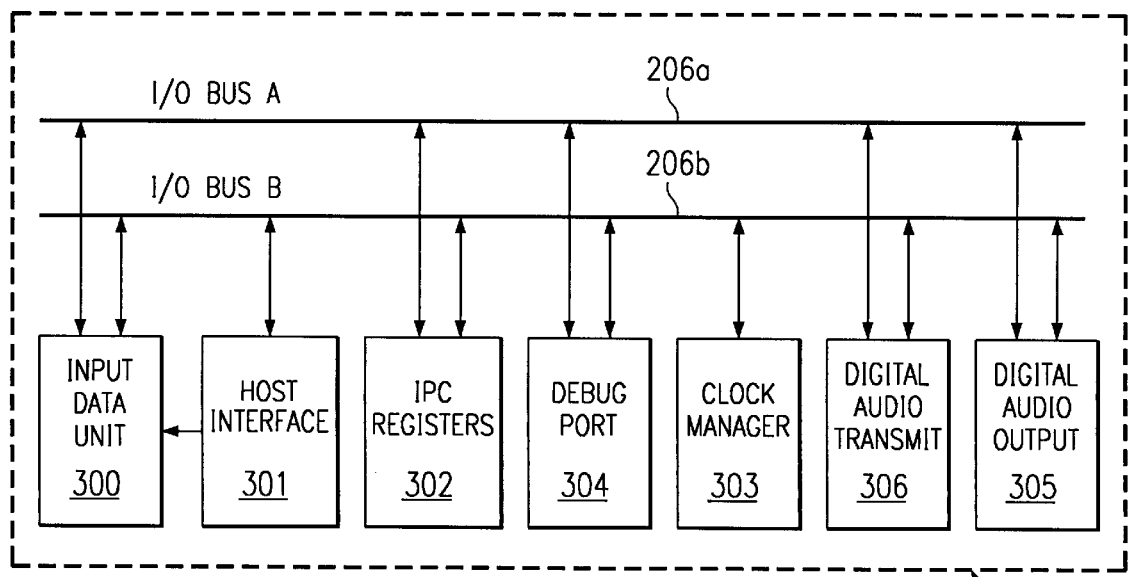
FIG. 3 is a diagram of the primary functional subblock of the I/O block of FIG. 1C.

FIG. 3 is a detailed functional block diagram of I/O block 102. Generally, I/O block 102 contains peripherals for data input, data output, communications, and control. Input Data Unit 300 accepts either compressed analog data or digital audio in any one of several input formats (from either the CDI or DAI ports). Serial/parallel host interface 301 allows an external controller to communicate with decoder 100 through the HOST port. Data received at the host interface port 301 can also be routed to input data unit 300.

IPC (Inter-processor Communication) registers 302 support a control-messaging protocol for communication between processing cores 200a and 200b over a relatively low-bandwidth communication channel. High-bandwidth data can be passed between cores 200a and 200b via shared memory 204 in processor block 101.

Clock manager 303 is a programmable PLL/clock synthesizer that generates common audio clock rates from any selected one of a number of common input clock rates through the CLKIN port. Clock manager 303 includes an STC counter which generates time stamp information used by processor block 101 for managing playback and synchronization tasks. Clock manager 303 also includes a programmable timer to generate periodic interrupts to processor block 101.

Debug circuitry 304 is provided to assist in applications development and system debug using an external DEBUGGER and the DEBUG port, as well as providing a mechanism to monitor system functions during device operation.

A Digital Audio Output port 305 provides multichannel digital audio output in selected standard digital audio formats. A Digital Audio Transmitter 306 provides digital audio output in formats compatible with S/PDIF or AES/EBU.

Many applications, including system 100, require bidirectional pads to support various two-way communications. One of the considerations during the design and implementation of such bidirectional pads is the ability to switch from a low impedance output mode to a high impedance input mode. One particular case is when the pad is driving a load at the logic high level and a switch to the high impedance state is required. In addition to increased crowbar current and power consumption, the pad may take several microseconds or even longer to fully transition between states.

Figure 4:
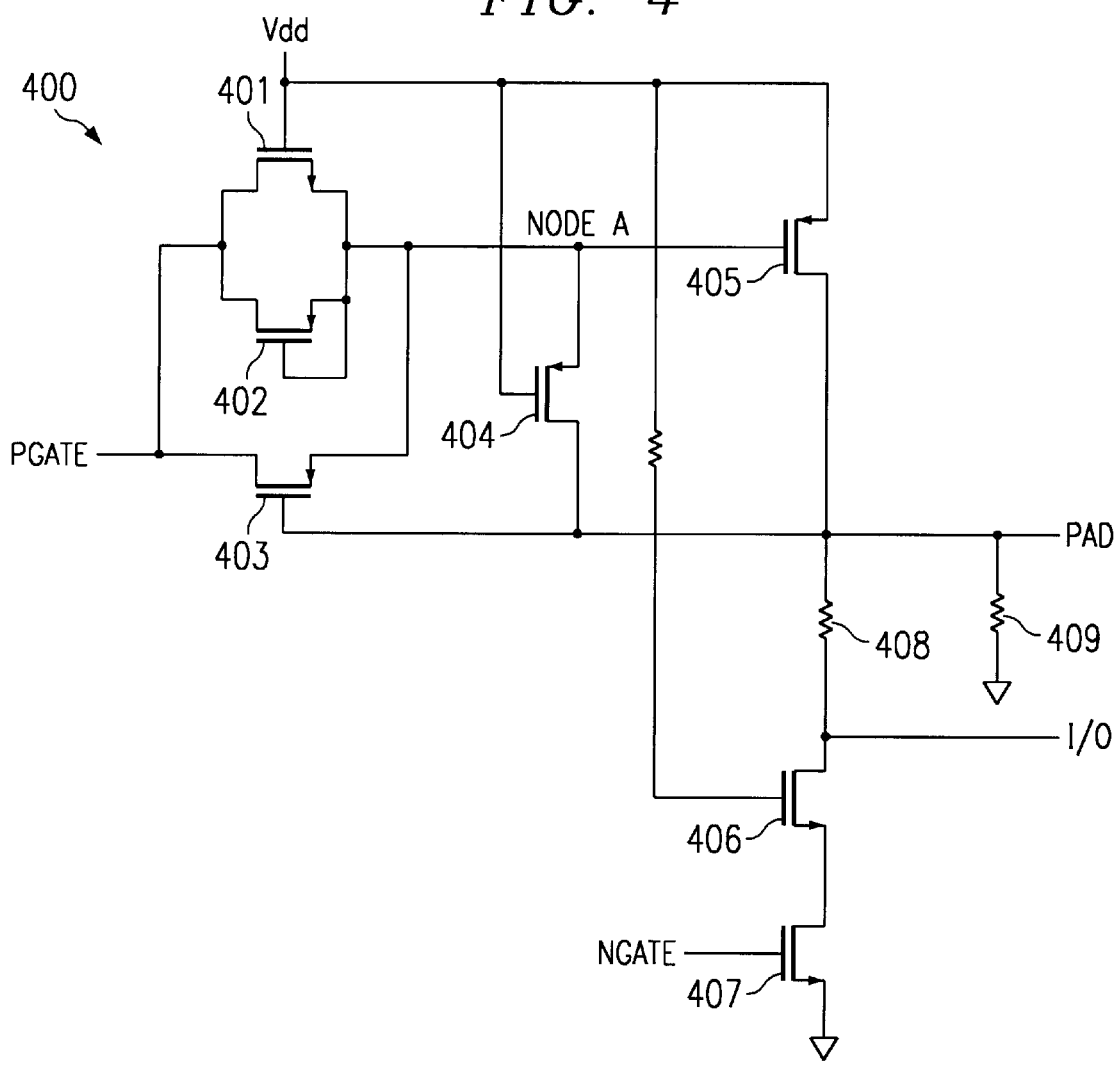
FIG. 4 is an electrical schematic diagram of preferred pad control circuitry according to the inventive concepts.

FIG. 4 is an electrical schematic diagram of preferred pad control circuitry 400 according to the inventive concepts. In this example, the terminal PAD is a bidirectional bond pad and/or pin. Additionally, it will assumed that the supply voltage Vdd is nominally 2.5 V, with PAD being 3.3 V tolerant. The signals PGATE and NGATE are nominally 2.5 V and are decoded as follows:

| PGATE | NGATE | SUM |
|-------|-------|-----|
| 0 | 0 | OUTPUT Logic 1 |
| 1 | 1 | OUTPUT Logic 0 |
| 1 | 0 | INPUT | where PGATE and NGATE are the data in the transmit mode and are control signals causing PAD to enter the high impedance state in the receive mode.

The signal asserted at PGATE is presented to drains of NMOS transistor 401 and PMOS transistors 402 and 403. The sources of transistors 401–403 are tied together, along with the gate of transistor 402. In this configuration PMOS transistor 402 acts as a diode, and as discussed further below, is selected to take advantageous use of the short channel effect. The gates of NMOS transistor 401 and PMOS transistor 403 are tied to Vdd and the PAD terminal, respectively.

The output is driven in the transmit mode PMOS transistor 405 and NMOS transistor 407. NMOS transistor 406 insures that the drain of transistor 407 does not see the 3.3V appearing at PAD in the receive mode by providing a threshold voltage drop VTN406.

Where, in the present example, Vdd is nominally 2.5V while the peak voltage on signal asserted at PAD in the receive mode is 3.3V. Transistor 404 insures that the 3.3V input signal does not couple to the 2.5 V voltage by turning on in response to the 3.3V signal and pulling Node A up towards 3.3V. In this state, output transistor 405 is fully turned-off such that no current path exists between PAD and the 2.5V supply rail.

In the preferred embodiment, the output resistor 409 of 1 MOhms or less is provided at PAD, although resistances of 10 MOhms or more could theoretically be used without undue degradation of performance.

Typically, the short channel effect is a difficulty which must be overcome during integrated circuit design. However, according to the present inventive principles, the short channel effect can be used to insure that the output of PAD control circuitry 400 properly transitions to a high impedance when switching from the transmit to the receive mode.

Consider the case where circuitry 400 is in the transmit mode and driving a logic high (logic 1) signal on PAD. Assume that the transition is being made to the high impedance output state for receiving data. If diode configured PMOS transistor 402 is not used, then the voltage at Node A settles at Vdd−VTN401 when PGATE transitions from a logic 0 to a logic 1, where VTN401 is the threshold voltage of NMOS transistor 401. With Node A at Vdd−VTN401, transistor 405 does not fully turn-off, leaving a current path between PAD and the supply voltage rail (i.e. the output impedance is significantly reduced). This is due to the body effect of transistor 401, where VTN401>VTP405, for submicron processes. Since VTN401>VTP405, transistor 401 cannot turn off transistor 405.

According to the inventive concepts, diode configured PMOS transistor 402 is included to prevent Node A from falling below Vdd−VTP402, where VTP402 is the threshold voltage of PMOS transistor 402. This is achieved by using the short channel effect of transistor 402 such that VTP402<VTP405, where VTP405 is the threshold voltage of PMOS output transistor 405. In other words, the channel length of diode configured transistor 402 is less than the channel length of output transistor 405. (This effect could be modeled for example by assuming that transistor 405 has a channel length of 600 nm and a width of 100 um and that transistor 402 has a channel length of 500 nm and a width of 10 um). As a result, when PGATE is in a logic high state (approx. Vdd), Vdd−VTP402>Vdd−VTP405, and therefore output transistor 405 is fully turns off (i.e. the metastable point has been overcome).

It should be noted that FIG. 4 is a functional representation of a circuit 400 embodying the inventive concepts. In an actual implementation, each of the depicted transistors may be constructed from one or more transistors, depending on the given integrated circuit design.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. Circuitry for controlling a bidirectional terminal comprising:
    an output transistor for selectively coupling said bidirectional terminal to a voltage rail, said output transistor turning on when a voltage at a control node falls below a preselected threshold voltage; and
    a diode coupled to said control node and having a threshold voltage lower than said threshold voltage of said transistor for maintaining said output transistor in a substantially turned-off state by maintaining said voltage at said control node above a voltage approximating said voltage rail less said threshold voltage of said transistor.

2. The circuitry of claim 1 wherein said output transistor comprises a PMOS transistor having a selected channel length and said diode comprises a diode-configured transistor having a selected channel length shorter than said channel length of said output transistor.

3. The circuitry of claim 1 wherein said threshold voltage of said diode is a function of the short channel effect.

4. The circuitry of claim 1 and further comprising a second transistor for selectively coupling a control signal having a voltage greater than said threshold voltage of said diode to said control node.

5. The circuitry of claim 1 and further comprising a voltage tolerance transistor having a current path coupling said terminal and said control node and a control terminal coupled to said voltage rail.

6. Bidirectional pad circuitry comprising:
    a first transistor of a first type having a drain for receiving a control signal, a source coupled to a control node and a gate coupled to a supply voltage rail;
    a second transistor of a second type having a drain coupled to said drain of said first transistor, and a gate and a source coupled to said control node; and
    a third transistor of said second type having a gate coupled to said control node, a source coupled to said supply voltage rail and a drain coupled to a bidirectional pad, a threshold voltage of said third transistor being greater than a threshold voltage of said second transistor.

7. The bidirectional pad circuitry of claim 6 wherein a channel of said second transistor is shorter than a channel of said third transistor.

8. The bidirectional pad circuitry of claim 6 wherein said second transistor has a threshold voltage lowered as a function of the short channel effect.

9. The bidirectional pad circuitry of claim 6 wherein said first transistor of said first type comprises an NMOS transistor and said second and third transistors of said second type comprise PMOS transistors.

10. The bidirectional pad circuitry of claim 6 and further comprising a fourth transistor of said second type having a source coupled to said control node, a drain coupled to said drain of said first transistor and a gate coupled to said pad.

11. The bidirectional pad circuitry of claim 6 and further comprising a fourth transistor of said second type having a source coupled to said control node, a gate coupled to said voltage supply rail and a drain coupled to said pad.

12. The bidirectional pad circuitry of claim 6 and further comprising:
    a fourth transistor of said first type having a drain coupled to said pad and a gate coupled to said voltage supply rail; and
    a fifth transistor of said first type having a drain coupled to a source of said fourth transistor, a source coupled to a low voltage rail and a gate for receiving a second control signal.

13. The bidirectional pad circuitry of claim 6 wherein said supply voltage rail has a nominal voltage of 2.5 V and said pad is operable to receive a signal with a nominal peak voltage of 3.3 V.

14. An integrated circuit comprising:

a bidirectional pad;

circuitry for receiving a signal presented at the bidirectional pad in a receive mode;

circuitry for transmitting a signal via the bidirectional pad in a transmit mode; and circuitry for controlling an impedance of the bidirectional pad comprising:

a first transistor of a first type for selectively pulling up the pad to a voltage rail in response to a voltage asserted at a control node;

a second transistor of a second type for selectively pulling down the pad to a low voltage rail in response to a first control signal;

a third transistor for coupling a second control signal to the control node; and a diode configured transistor of the first type and having a threshold voltage lower than a threshold voltage of the first transistor for maintaining the first transistor in an off state when the control node is at a logic high voltage.

15. The integrated circuit of claim 14 wherein the received signal has a peak voltage higher than the voltage rail and the circuitry for controlling the impedance of the pad further comprises a fourth transistor for pulling up the control node to a voltage above the threshold voltage of the first transistor for voltage tolerance.

16. The integrated circuit of claim 14 and further comprising a fourth transistor of the second type coupling the second transistor and the pad for voltage tolerance.

17. The integrated circuit of claim 14 and further comprising a fourth transistor of the first type for selectively coupling an input node and the control node in response to a voltage at the pad.

18. The integrated circuit of claim 14 wherein the circuitry for receiving comprises an audio decoder.

19. The integrated circuit of claim 14 wherein the circuitry for transmitting comprises an audio decoder.

20. The integrated circuit of claim 14 wherein the transistors comprise metal oxide field effect transistors.

* * * * *